US008522197B2

(12) United States Patent
Gutberlet et al.

(10) Patent No.: US 8,522,197 B2
(45) Date of Patent: Aug. 27, 2013

(54) HIERARCHICAL PRESENTATION TECHNIQUES FOR A DESIGN TOOL

(75) Inventors: Peter Pius Gutberlet, Wilsonville, OR (US); Simon Joshua Waters, Newberg, OR (US); Bryan Darrell Bowyer, Newberg, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 106 days.

(21) Appl. No.: 12/956,738

(22) Filed: Nov. 30, 2010

(65) Prior Publication Data
US 2011/0138348 A1 Jun. 9, 2011

Related U.S. Application Data

(60) Continuation of application No. 11/517,637, filed on Sep. 8, 2006, now Pat. No. 7,844,944, which is a division of application No. 09/919,650, filed on Jul. 31, 2001, now Pat. No. 7,120,879.

(60) Provisional application No. 60/285,656, filed on Apr. 20, 2001.

(51) Int. Cl.
*G06F 9/44* (2006.01)
*G06F 9/45* (2006.01)
*G06F 17/50* (2006.01)

(52) U.S. Cl.
USPC ........... 717/105; 717/109; 717/150; 717/151; 716/102; 716/104; 716/106; 716/108

(58) Field of Classification Search
None
See application file for complete search history.

(56) References Cited

U.S. PATENT DOCUMENTS

| | | | |
|---|---|---|---|
| 5,093,794 A | | 3/1992 | Howie et al. |
| 5,109,337 A | * | 4/1992 | Ferriter et al. .................. 705/29 |
| 5,339,390 A | | 8/1994 | Robertson et al. |
| 5,485,574 A | | 1/1996 | Bolosky et al. |
| 5,600,567 A | * | 2/1997 | Kucukcakar et al. ......... 716/102 |
| 5,745,110 A | | 4/1998 | Ertemalp |
| 5,801,958 A | | 9/1998 | Dangelo et al. |
| 5,826,236 A | | 10/1998 | Narimatsu et al. |
| 5,867,399 A | * | 2/1999 | Rostoker et al. .............. 716/102 |
| 5,890,997 A | | 4/1999 | Roth |
| 5,937,190 A | | 8/1999 | Gregory et al. |
| 6,175,949 B1 | | 1/2001 | Gristede et al. |
| 6,219,822 B1 | | 4/2001 | Gristede et al. |
| 6,289,498 B1 | | 9/2001 | Dupenloup |

(Continued)

OTHER PUBLICATIONS

Elliott, J., *An Introduction to Architectural Exploration*, "Part I: Introduction & Terminology," 8pp. (Mar. 1998).

(Continued)

*Primary Examiner* — Isaac Tecklu
(74) *Attorney, Agent, or Firm* — Klarquist Sparkman, LLP

(57) ABSTRACT

A design tool hierarchically presents information about a design with nested blocks. For example, the design tool presents scheduling information for the design in a hierarchical Gantt chart. The scheduling information includes hierarchical design schedule blocks which accurately depict the timing and scheduling of the nested blocks of the design. Each of the hierarchical design schedule blocks includes control steps numbered relative to the block. The scheduling information also includes a hierarchical list of scheduled operations for the design. The hierarchical list emphasizes which operations are associated with which nested blocks. The scheduling information further includes pseudo-operation icons that are easily differentiated from real operation icons in the hierarchical Gantt chart.

19 Claims, 13 Drawing Sheets

(56) References Cited

U.S. PATENT DOCUMENTS

| | | | |
|---|---|---|---|
| 6,324,678 B1 | 11/2001 | Dangelo et al. | |
| 6,397,341 B1 | 5/2002 | Genevriere | |
| 6,477,683 B1 * | 11/2002 | Killian et al. | 716/106 |
| 6,505,339 B1 * | 1/2003 | Miller et al. | 716/104 |
| 6,513,154 B1 | 1/2003 | Porterfield | |
| 6,900,807 B1 * | 5/2005 | Liongosari et al. | 345/440 |
| 7,120,879 B2 | 10/2006 | Gutberlet et al. | |
| 7,275,237 B1 | 9/2007 | Schneider et al. | |
| 7,353,467 B2 | 4/2008 | Robertson et al. | |
| 7,379,888 B1 | 5/2008 | Mahapatro | |
| 7,712,050 B2 | 5/2010 | Gutberlet et al. | |
| 7,844,944 B2 | 11/2010 | Gutberlet et al. | |
| 2002/0120489 A1 | 8/2002 | Matsuda et al. | |
| 2008/0033777 A1 | 2/2008 | Shukoor | |

OTHER PUBLICATIONS

Elliott, J., *An Introduction to Architectural Exploration*, "Part II: I/O Modes," 12pp. (Apr. 1998).

Elliott, J., *An Introduction to Architectural Exploration*, "Part III: Loops," 8pp. (Apr. 1998).

Elliott, J., *An Introduction to Architectural Exploration*, "Part IV: Handshaking," 4pp. (Apr. 1998).

Elliott, J., *An Introduction to Architectural Exploration*, "Part V: Reusable Test Benches," 8pp. (Apr. 1998).

Elliott, J.P., *Understanding Behavioral Synthesis*, "Table of Contents," "Chapter 2: An Introduction to Behavioral Synthesis," "Chapter 3: The Behavioral Synthesis Process," "Chapter 5: Entities, Architectures, and Processes," "Chapter 6: Loops," "Chapter 7: I/O Scheduling Modes," "Chapter 8: Pipelining," "Chapter 13: Coding for Behavioral Synthesis," "Chapter 15: Case Study: FIR Filter," "Chapter 16: Case Study: Viterbi Decoding," "Index," Kluwer Academic Publishers Group, pp. v-xiv, 5-23, 25-40, 57-76, 77-103, 105-134, 136-154, 213-243, 263-272, 274-284, 313-319 (1999).

Glen, "Microsoft Project: 4—Manipulating the Data," 6 pp. [downloaded from the World Wide Web on Apr. 13, 2005].

Kennemer, "Put text where you need it on your Microsoft Project Gantt chart," 6 pp. [downloaded from the World Wide Web on Apr. 13, 2005].

Marmel, "Microsoft Project 2000 Bible," IDG Books Worldwide, Inc.

"Monet Interactive Architectural Exploration Through Behavioral Design," 3pp. (Mar. 2001).

"Monet Technical Papers," 1p. (Mar. 2001).

\* cited by examiner

Figure 1: prior art VHDL listing

```
LIBRARY ieee;
USE ieee.std_logic_1164.ALL;                                100
USE ieee.std_logic_arith.ALL;

ENTITY test IS
        PORT(
                clk : IN std_logic;
                rst : IN std_logic;
                in1 : IN unsigned(7 downto 0);
                in2 : IN unsigned(7 downto 0);
                out1 : OUT unsigned(7 downto 0)
        );
END;

ARCHITECTURE behavioral OF test IS
BEGIN
        main : PROCESS
                VARIABLE min1 : unsigned(7 downto 0);
                VARIABLE min2 : unsigned(7 downto 0);
        BEGIN
                WAIT UNTIL (clk'EVENT and clk = '1');
                min1 := in1;
                min2 := in2;
                loop1 : WHILE ( min1 < min2 ) LOOP
                        IF (min2 > 0) THEN
                                FOR x IN 0 TO 7 LOOP
                                        min1 := min1 + min2;
                                        min2 := min2 -1;
                                END LOOP;
                        ELSE
                                FOR x IN 10 DOWNTO 5 LOOP
                                        min1 := min1 - x;
                                END LOOP;
                        END IF;
                END LOOP;
                out1 <= min1 * min2;
        END PROCESS;
END;
```

110, 120, 130, 140

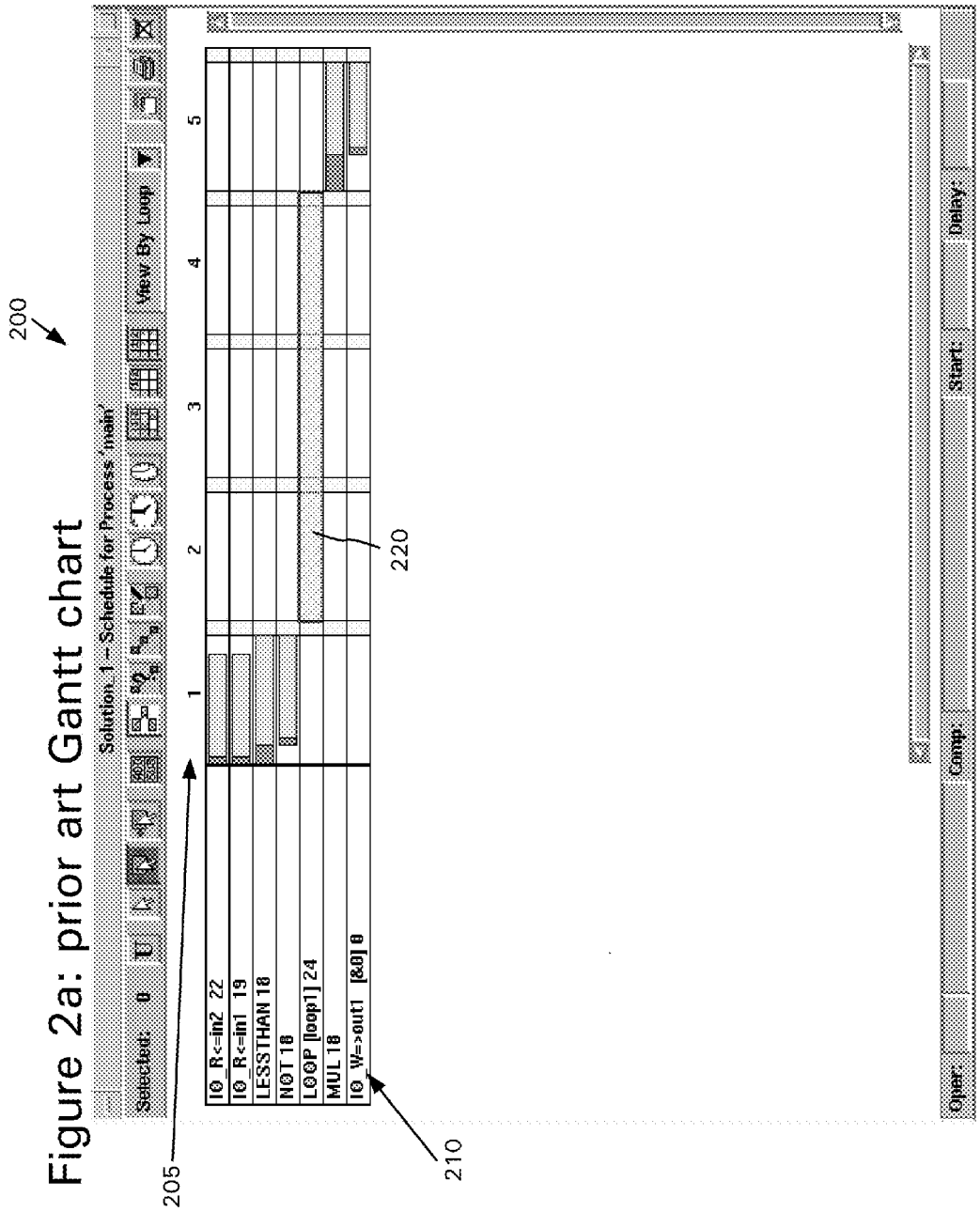

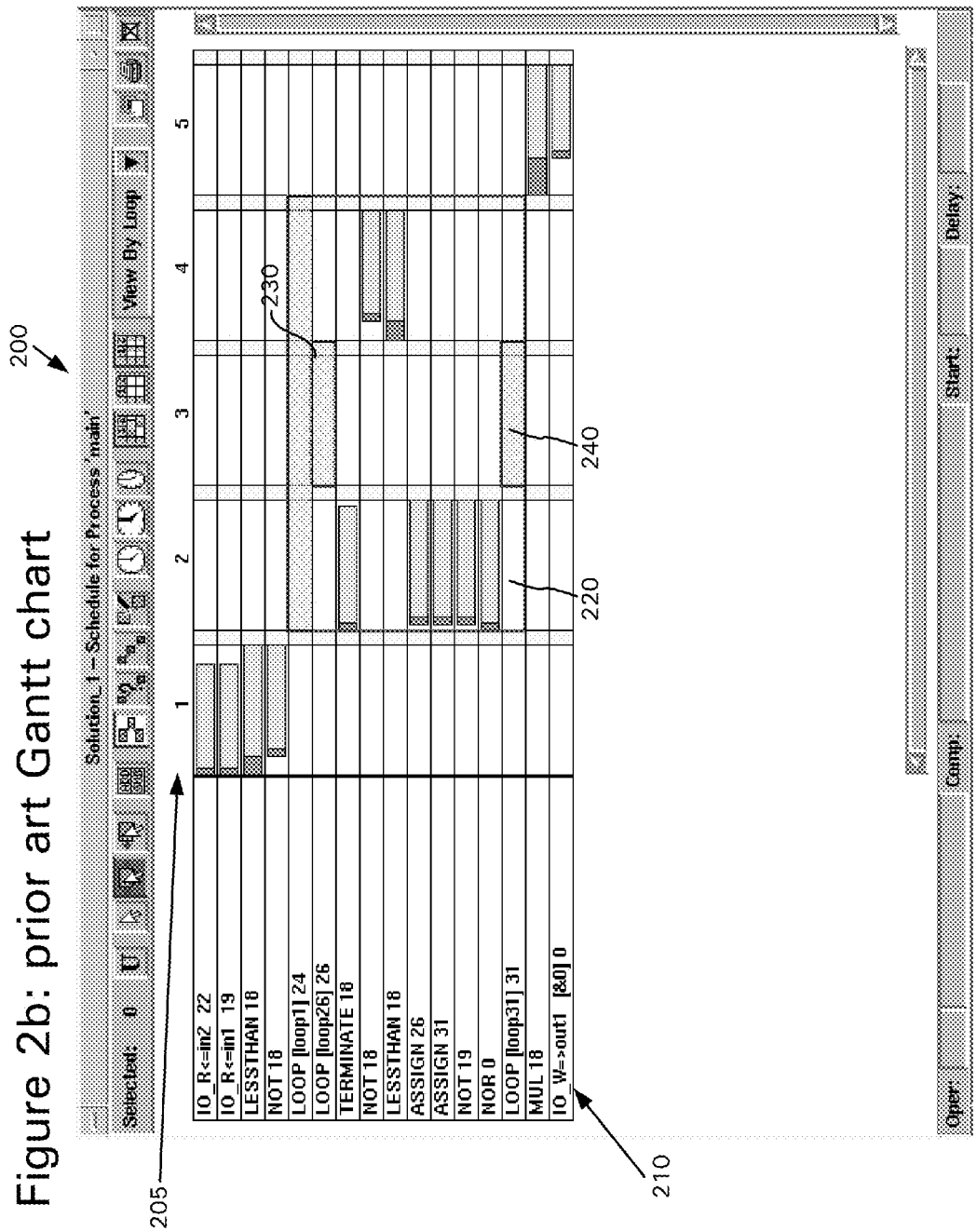
Figure 2b: prior art Gantt chart

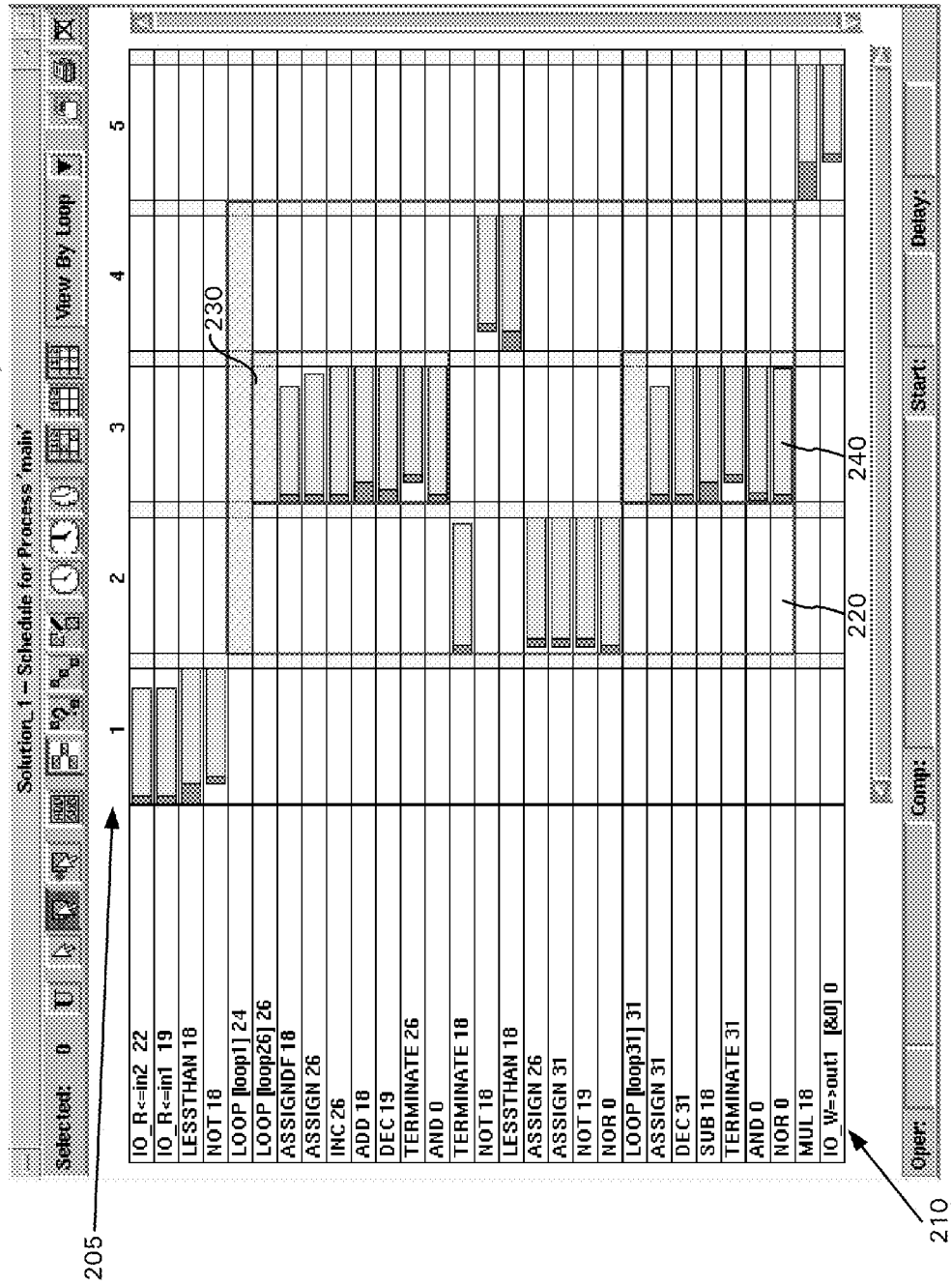
Figure 2c: prior art Gantt chart

Design Tool Software 380 With Hierarchical Presentation of Scheduling Information

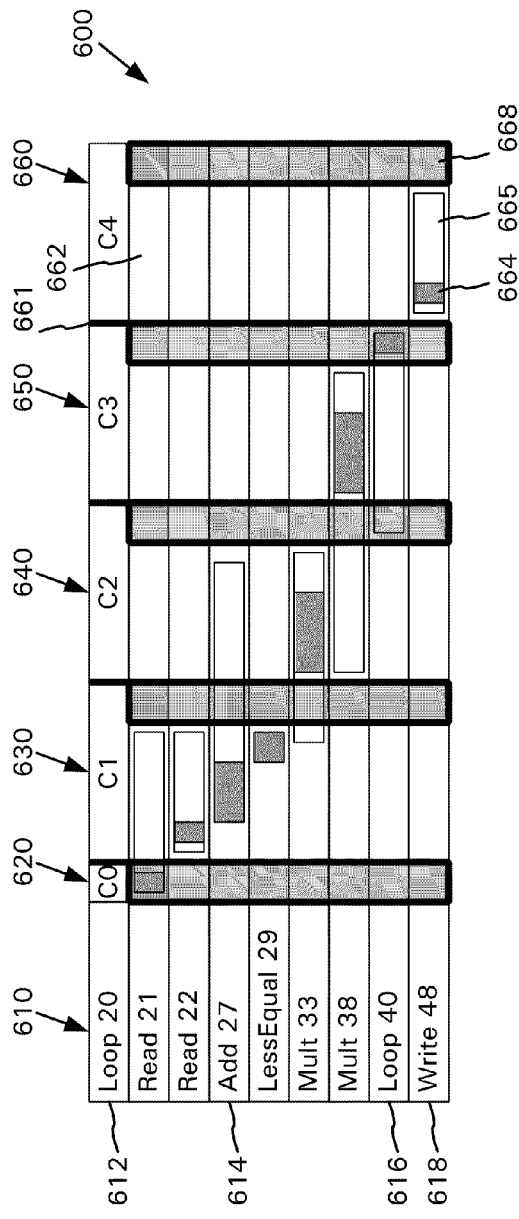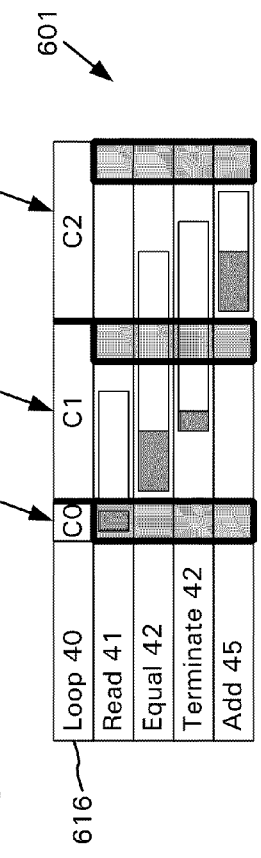

HIERARCHICAL PRESENTATION TECHNIQUES FOR A DESIGN TOOL

RELATED APPLICATION DATA

This application is a continuation of U.S. patent application Ser. No. 11/517,637, filed Sep. 8, 2006 now U.S. Pat. No. 7,844,944, which is a divisional of U.S. patent application Ser. No. 09/919,650, filed Jul. 31, 2001 now U.S. Pat. No. 7,120,879, which claims the benefit of U.S. Provisional Patent Application Ser. No. 60/285,656, filed Apr. 20, 2001, all of which are hereby incorporated herein by reference.

TECHNICAL FIELD

The present invention pertains to presentation of information by a design tool. For example, the design tool displays scheduling information for a design in a hierarchical Gantt chart.

BACKGROUND

A design tool simplifies the process of specifying the design of an electronic circuit or system. With a design tool, a designer specifies the design in a way that abstracts away certain timing and structural details. The design tool then transforms the higher-level specification into a lower-level specification that is closer to an actual hardware implementation. The design tool shields the designer from many of the complexities of the design, making the design process faster and more cost effective.

Different design tools provide different ways for a designer to specify a design. Some design tools accept textual specifications from the designer; other design tools accept graphical specifications. While some design tools accept high-level, abstract specifications of design behavior, other design tools require low-level specifications with hardware details.

A behavioral synthesis tool is one kind of design tool. With a behavioral synthesis tool, the designer specifies a design by describing the behavior of the design. Many behavioral synthesis tools work with a hardware description language ["HDL"] such as VHDL or VERILOG®. For additional information about electronic design automation, behavioral synthesis tools, and HDLs, see John P. Elliott, Understanding Behavioral Synthesis, Kluwer Academic Publishers (1999).

FIG. 1 shows a VHDL listing (100) for a simple design with nested loops. After standard code that defines support libraries, an interface, and local variables, the VHDL listing (100) includes a main body with several nested loops. The main body includes a main loop (110) enclosing a WHILE loop (120). The WHILE loop (120) in turn encloses first and second FOR loops (130, 140). Although the VHDL listing (100) is fairly simple, a VHDL listing for a real-world application can contain hundreds or thousands of lines of code.

A good design tool provides the designer with accurate and helpful information about the design. For different stages in the design process, design tools use different techniques to present information about the design. For example, many design tools use a Gantt chart to present the results of scheduling the design process. In scheduling, a design tool assigns the operations of the design to steps timed by a clock.

FIGS. 2a-2c show a Gantt chart (200) presenting a design schedule for the design of FIG. 1. The top row (205) of the Gantt chart (200) includes labels for control steps ["c-steps"] 1-5 of the design schedule. The c-steps partition the operations of the design schedule into clock cycles, where each c-step includes scheduled operations that are performed in a clock cycle. The design schedule begins at c-step 1 and proceeds to the right. The leftmost column (210) of the Gantt chart (200) lists labels for the scheduled operations of the design. The numbers in the labels relate to line numbers in the design specification.

To show the design schedule at different levels, the Gantt chart (200) expands or collapses presentation of scheduling information for loops. In FIG. 2a, for example, the Gantt chart (200) presents the design schedule and list of scheduled operations for the main loop (110), but hides that information for the nested loops (120, 130, 140). In FIGS. 2b and 2c, the Gantt chart (200) adds design schedule details and lists scheduled operations for the WHILE loop (120) and the FOR loops (130, 140) respectively.

When the Gantt chart (200) hides scheduling information for a loop, the leftmost column (210) summarizes operations within the loop using a LOOP operation label. The loop is graphically presented as a rectangular outline in the design schedule of the enclosing loop. The outline extends for the number of clock cycles taken by one iteration of the nested loop. Thus, FIG. 2a includes a rectangular outline (220) representing the WHILE loop (120), and FIGS. 2b and 2c include rectangular outlines (230, 240) representing the FOR loops (130, 140).

Within the Gantt chart (200), each of the listed scheduled operations is represented with a rectangular icon. The width of the rectangular icon roughly indicates the actual delay of the operation. For example, a multiplication operation takes longer than a comparison operation, so the icon for a MUL operation is wider than the icon for a LESSTHAN operation.

Although the Gantt chart (200) helps a designer understand a design schedule, the Gantt chart (200) has several shortcomings with respect to the presentation of nested loops.

With reference to FIGS. 1 and 2a-2c, the c-step numbering in the Gantt chart (200) does not accurately illustrate the actual timing of execution of the nested loops. For example, in FIGS. 2a-2c, c-step 5 of the main loop does not execute four clock cycles after c-step 1, but rather executes an indeterminate number of clock cycles after c-step 1 due to the nested loops (120, 130, 140). As another example, suppose min1 is greater than min2 at the start. The WHILE loop (120) and FOR loops (130, 140) never execute, and c-step 5 does not execute four clock cycles after c-step 1. Using the c-step numbers of the main loop for nested loops is misleading in several respects.

Aside from c-step numbering, the presentation of nested loops in the Gantt chart (200) may not correctly illustrate actual scheduling. With some design tools, a nested loop is scheduled separately from its enclosing loop, potentially under different constraints. Thus, presenting a nested loop in the same timing and scheduling context as its enclosing loop can be misleading.

Further, the list of scheduled operations in the Gantt chart (200) obscures the nesting relationships between loops. The list does not clearly indicate which operations are for which loops, or whether a loop is expanded or collapsed.

Finally, the rectangular icons for scheduled operations do not accurately represent actual delay for many types of scheduled operations. For a scheduled operation with a short delay or no real delay, the icon has a minimum, visible width which does not accurately represent actual delay. Moreover, none of the icons is marked or otherwise distinguished from other icons, making it harder for the designer to associate icons with scheduled operations.

SUMMARY

The present invention relates to presentation of information by a design tool. The design tool presents information about a design in ways that illustrate how the design will actually execute and that a designer easily understands.

The present invention includes various presentation techniques and tools, which can be used in combination or independently.

According to a first aspect of the present invention, a design tool hierarchically presents information about a design in a way that accurately shows the timing and scheduling of the design. For example, for a design with nested blocks, the design tool presents a design schedule in a hierarchical Gantt chart. The design schedule includes a block for each loop of the design, which reflects separate scheduling of loops of the design. Each block includes c-steps numbered relative to the block, which accurately illustrates the timing of execution of blocks in the design. The designer interactively evaluates the design schedule by expanding and collapsing blocks. As the designer expands and collapses nested blocks, design schedule information for specific blocks can be displayed in a nested manner or displayed in separate windows. Hierarchical presentation of nested blocks emphasizes the independent, iterative nature of the nested blocks and explicitly shows the hierarchical relationships between nested blocks.

According to a second aspect of the present invention, a design tool hierarchically presents a list of operations for a design with nested blocks. The list emphasizes which operations are associated with which blocks. For example, the design tool presents a hierarchical textual list of operation labels in a hierarchical Gantt chart. The labels for operations of a nested block are indented relative to the labels for operations of its enclosing block. An icon next to a label for the nested block indicates whether the nested block is expanded or collapsed.

According to a third aspect of the present invention, a design tool presents pseudo-operation icons easily differentiated from real operation icons in a design schedule. For example, the design tool presents rectangular icons for operations with real delay, with icon width indicating delay. The design tool presents circular icons for other operations. The design tool also presents each operation icon with one or more characters to identify its operation.

Additional features and advantages of the invention will be made apparent from the following detailed description of an illustrative embodiment that proceeds with reference to the accompanying drawings.

BRIEF DESCRIPTION OF THE DRAWINGS

FIG. 1 is a prior art VHDL listing for a design with nested loops.

FIGS. 2a-2c are screen shots of a prior art Gantt chart showing a design schedule for the design of FIG. 1.

FIG. 6a-6d are diagrams of hierarchical design schedule blocks according to the illustrative embodiment.

DETAILED DESCRIPTION

Figure 3:
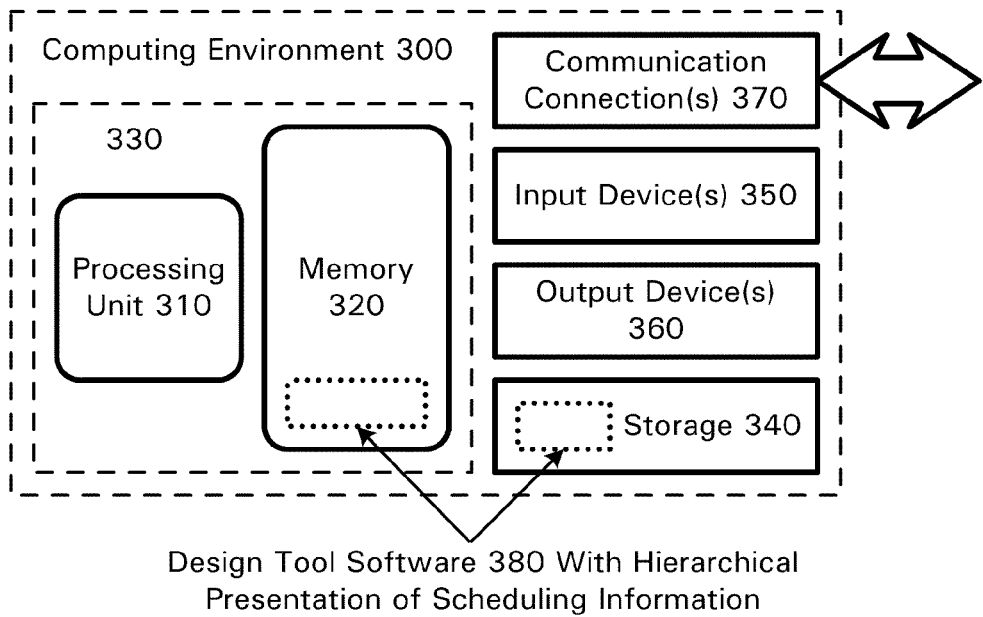
FIG. 3 is a block diagram of a suitable computing environment for implementing the illustrative embodiment.

The illustrative embodiment of the present invention is directed to hierarchical presentation of scheduling information with a design tool. For a design with nested blocks, the design tool presents a hierarchical list of scheduled operations and hierarchical design schedule blocks in a hierarchical Gantt chart. A designer interactively explores the design schedule by expanding or collapsing presentation of scheduling information for blocks. Hierarchical presentation of scheduling information for nested blocks emphasizes the independent, iterative nature of the nested blocks and explicitly shows the hierarchical relationships between nested blocks.

In the illustrative embodiment, the design tool presents design schedule blocks in a way that accurately illustrates the timing of actual execution of the design schedule. For a design with nested loops, each loop of the design has a corresponding design schedule block. In addition, one or more branches of execution within a loop can each have a corresponding design schedule block.

A design schedule block has its own set of control steps ["c-steps"]. The numbering of an enclosing block's c-steps is independent of actual delay of a nested block. Thus, whether the nested block executes for one clock cycle or 1,000 clock cycles, the numbering of c-steps in the enclosing block is consistent, even when the nested block executes conditionally or itself includes alternative branches of execution (e.g., branches of an if/then statement) with different lengths.

In some design schedules, certain operations of a nested block can execute in the clock cycle of a preceding c-step of the enclosing block. For example, the assignment and termination operations of the nested WHILE loop (120) of FIG. 1 can execute in the clock cycle for c-step 1 of the main loop; these operations need not execute in a subsequent clock cycle. In the illustrative embodiment, the design tool shows the WHILE loop collapsed as a single icon in the clock overhead space of a c-step of the main loop. In expanded form, the design tool can present assignments, control flow logic, and other WHILE loop operations with negligible or no delay as associated with a c-step of the WHILE loop, but scheduled for execution in the clock cycle of a preceding c-step of the main loop. Thus, scheduled operations of the WHILE loop are associated with the WHILE loop, but the actual execution of the operations is also illustrated.

In the illustrative embodiment, the design tool presents design schedule blocks in a way that reflects the actual scheduling of the design schedule. The design tool separately schedules blocks of operations, potentially scheduling different blocks according to different constraints. The design tool presents design schedule blocks in a way that facilitates interactive setting of scheduling constraints for one block at a time. For example, a design schedule block for a nested loop is numbered with an independent set of c-steps and set apart from the design schedule block for the enclosing loop.

In the illustrative embodiment, the design tool presents design schedule blocks in a nested manner or in separate windows as a designer navigates a design schedule. These presentation techniques help the designer focus on particular design schedule blocks by hiding or deemphasizing other design schedule blocks. These techniques also facilitate the presentation of a large design schedule in an understandable manner by selectively hiding or deemphasizing blocks of the design schedule.

In the illustrative embodiment, the design tool presents a hierarchical list of scheduled operation labels in the hierarchical Gantt chart. The design tool indents labels for operations of a nested block relative to the labels for operations of its enclosing block. The design tool presents an icon adjacent a label for the nested block that indicates whether the nested block is expanded or collapsed. Hierarchical presentation of operation labels makes it easier for the designer to associate operation labels with scheduled operations in the hierarchical Gantt chart.

In the illustrative embodiment, the design tool presents pseudo-operation icons along with real operation icons in the hierarchical Gantt chart. The real operation icons are rectangular, with width indicating delay for real operations; the pseudo-operation icons are circular, representing notional scheduled operations or operations with negligible delay. The design tool presents each operation icon with one or more characters to identify the operation. These techniques more accurately portray actual delay for operations with negligible or no delay and help the designer understand the design schedule.

In alternative embodiments, a design tool performs a subset of the functions described above. For example, the design tool hierarchically presents only design schedule blocks, only hierarchical operation lists, or only pseudo-operation icons. The design tool can perform any of the functions described above in combination with other design tool functions.

In other alternative embodiments, a design tool performs the presentation techniques described above for information other than scheduling information and/or at a different stage in the design process.

I. Computing Environment

FIG. 3 illustrates a generalized example of a suitable computing environment (300) in which the illustrative embodiment may be implemented. The computing environment (300) is not intended to suggest any limitation as to scope of use or functionality of the invention, as the present invention may be implemented in diverse general-purpose or special-purpose computing environments, including computing environments that lack one or more components shown in FIG. 3.

With reference to FIG. 3, the computing environment (300) includes at least one processing unit (310) and memory (320). In FIG. 3, this most basic configuration is included within dashed line (330). The processing unit (310) executes computer-executable instructions and may be a real or a virtual processor. In a multi-processing system, multiple processing units execute computer-executable instructions to increase processing power. The memory (320) may be volatile memory (e.g., registers, cache, RAM), non-volatile memory (e.g., ROM, EEPROM, flash memory, etc.), or some combination of the two. The memory (320) stores design tool software (380). The design tool software (380) includes software for hierarchically presenting scheduling information.

The computing environment (300) includes storage (340), one or more input devices (350), one or more output devices (360), and one or more communication connections (370). An interconnection mechanism (not shown) such as a bus, controller, or network interconnects the components of the computing environment (300). Typically, one or more layers of operating system software (not shown) provide an operating environment for other software executing in the computing environment (300), and coordinate activities of the components of the computing environment (300). The operating system software exposes standard services (e.g., graphics services, input/output services) through programming interfaces that can be used by the design tool software (380). The design tool software (380) itself can provide other functions for hierarchical presentation of scheduling information.

The storage (340) may be removable or non-removable, and may be magnetic disk, magnetic tape or cassette, CD-ROM, DVD, or any other medium which can be used to store information and which can be accessed within the computing environment (300). The storage (440) stores instructions for the design tool software (380).

The input device(s) (350) may be a touch input device such as a keyboard, mouse, pen, or trackball, a voice input device, a scanning device, or another device that provides input to the computing environment (300). The output device(s) (360) may be a display, printer, speaker, or another device that provides output from the computing environment (300).

The communication connection(s) (370) enable communication over a communication medium to another computing entity. The communication medium conveys information such as computer-executable instructions or other data in a modulated data signal. A modulated data signal is a signal that has one or more of its characteristics set or changed in such a manner as to encode information in the signal. By way of example, and not limitation, communication media include wired or wireless techniques implemented with an electrical, optical, RF, infrared, acoustic, or other carrier.

The invention can be described in the general context of computer-readable media. Computer-readable media are any available media that store or carry a modulated data signal and can be accessed within a computing environment. By way of example, and not limitation, with the computing environment (300), computer-readable media include memory (320), storage (340), communication connection(s) (370), and combinations of any of the above.

The invention can be described in the general context of computer-executable instructions, such as those included in program modules, being executed in a computing environment on a target real or virtual processor. Generally, program modules include routines, programs, libraries, objects, classes, components, data structures, etc. that perform particular tasks or implement particular abstract data types. The functionality of the program modules may be combined or split between program modules as desired in various embodiments. Computer-executable instructions for program modules may be executed within a local or distributed computing environment.

For the sake of presentation, the detailed description uses terms like "determine," "receive," "present," and "hide" to describe computer-implemented operations in a computing environment. These terms are high-level abstractions for operations performed by a computer, and should not be confused with acts performed by a human being.

II. Design Tool

In the illustrative embodiment, a design tool presents cycle-accurate scheduling information for a design in a hierarchical Gantt chart. For a design with one or more nested blocks, the hierarchical Gantt chart presents design schedule blocks, lists of scheduled operations, and pseudo-operation icons.

Figure 4:
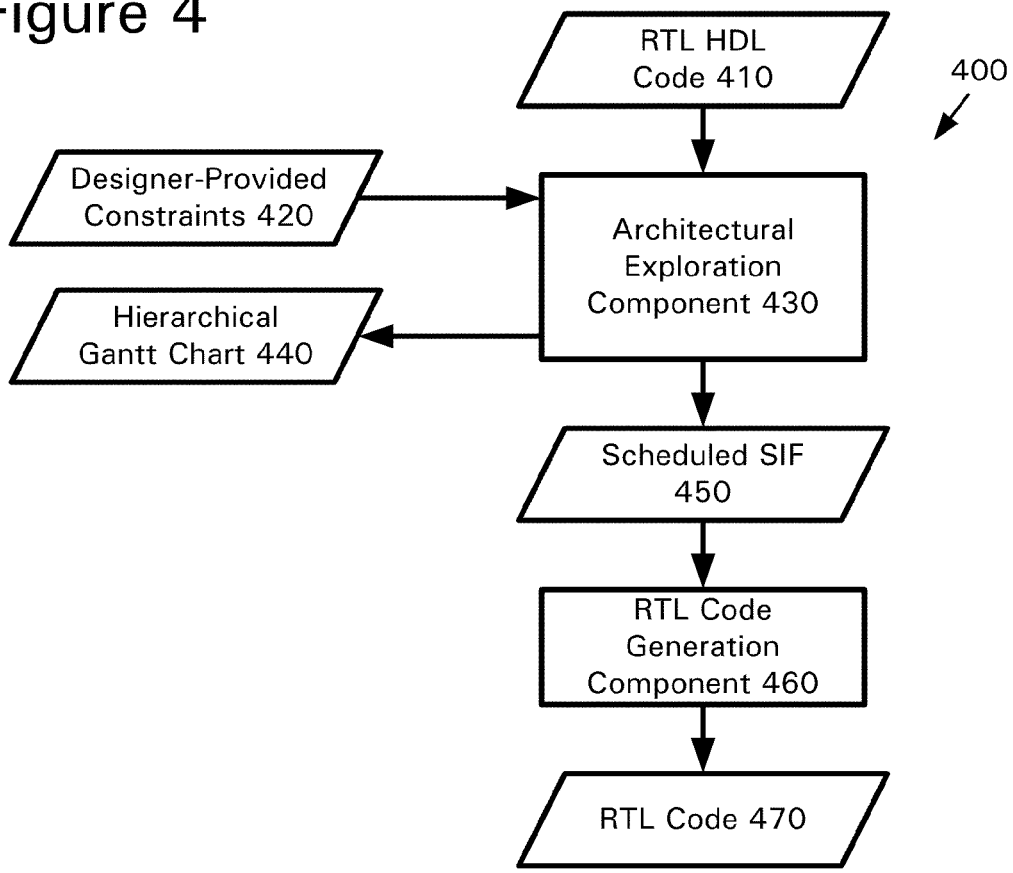
FIG. 4 is a block diagram of a design tool that presents scheduling information according to the illustrative embodiment.

FIG. 4 shows a design tool (400) that presents scheduling information in a hierarchical Gantt chart. The design tool (400) lets the designer evaluate alternative architectures for the design before selecting an implementation that satisfies performance and cost goals desired or required by the designer. For a target architecture, the design tool (400) schedules the design. Based upon various timing and resource constraints, the design tool (400) assigns the operations of the design to c-steps. The design tool (400) presents the results of scheduling in a hierarchical Gantt chart (450).

For the sake of presentation, FIG. 4 shows the components of the design tool (400) that are most closely connected with the presentation of scheduling information. FIG. 4 does not show components for earlier and later stages of the design process, or simulation and verification. In one embodiment, the components of the design tool (400) are provided through a behavioral synthesis tool such as MONET® from Mentor Graphics Corporation.

Depending on implementation, components of the design tool (400) can be added, omitted, split into multiple components, combined with other components, or replaced with like components. In alternative embodiments, the hierarchical Gantt chart is presented using a design tool having different components, another configuration of components, and/or at other stages of a design process. In such alternative embodiments, the hierarchical Gantt chart presents information based upon design representations in the intermediate formats or data structures (e.g., flow graphs, syntax trees) used in the design tools.

A. HDL Code

The design tool (400) accepts HDL code (410) for a design from the designer, an upstream design tool component, or another mechanism. For example, the design tool (400) accepts the VHDL listing (100) of FIG. 1.

Alternatively, the design tool (400) accepts a specification for a design in another language (e.g., a higher-level language such as C++ or a lower-level language such as an RTL language), and the specification is input textually or graphically. In such alternative embodiments, the design tool (400) can transform the accepted specification into a form suitable for behavioral synthesis.

B. Designer-Provided Constraints

A set of designer-provided constraints (420) guides architectural exploration for a target technology parameterized by the designer-provided constraints (420). Table 1 introduces various designer-provided constraints.

TABLE 1

Designer-Provided Constraints

| Constraint | Description |
| --- | --- |
| Clock cycle | The clock frequency/period for the design schedule. |
| Resource types | One or more types of components (e.g., adder, multiplier) onto which operations (e.g., addition, multiplication) can be mapped. The component type determines the delay for an operation. |
| Resource numbers | A constraint on the number of available components, which influences whether identical operations will each need a component or will share a single component. |
| Relative timing | A constraint on the relative positions of two operations in a design schedule block. |
| Absolute timing | A constraint specifying a particular location for an operation in a design schedule block. |
| Latency | A constraint that specifies a latency in a design schedule block. |

The designer specifies the designer-provided constraints (420) through a graphical user interface or other mechanism. This allows the designer to set a tradeoff between cost and quality of resources, or a tradeoff between number of resources and speed of the implementation.

In addition to the designer-provided constraints (420), the HDL code (410) typically implies certain constraints such as data dependencies and input/output timing requirements. Upstream design tool components typically provide other constraints (e.g., actual resource assignments, resource sharing, initiation interval) to downstream design tool components.

Alternative embodiments use fewer constraints, additional constraints, or different formulations of constraints to guide scheduling and architectural exploration. Additional types of constraints include constraints for interactive memory allocation (to explore different memory/register/array possibilities), interactive loop handling (to explore rolling/unrolling of loops), pipelining, and area.

C. Architectural Exploration

An architectural exploration component (430) accepts the HDL code (410) and the designer-provided constraints (420). The architectural exploration component (430) converts the HDL code (410) to an architecture-specific implementation for a target FPGA or ASIC technology, presenting scheduling results to the designer in the hierarchical Gantt chart (440). For an implementation selected by the designer, the architectural exploration component (430) outputs scheduled synthesis intermediate format ["SIF"] code (450). In alternative embodiments, the architectural exploration component outputs code in another intermediate format or structured representation.

In general, architectural exploration involves transformations and architectural choices including: loop pipelining, mapping of arrays into memories and vice versa, loop transformations such as loop unrolling (which expose parallelism leading to architectures that have higher performance), selection of clock period, selection of the type and number of components that are allocated, and selection of how I/O and operations are scheduled. Internally, the architectural exploration component (430) does automated exploration as well as optimizations such as common-sub-expression elimination, dead-code elimination, constant propagation.

The architectural exploration component (430) operates in several stages, transforming the HDL code (410) through several intermediate formats before outputting the scheduled SIF code (450).

1. Transforming HDL to SIF

Initially, the architectural exploration component (430) converts the HDL code (410) into a SIF representation. Later transformations, including scheduling, operate upon data in the SIF representation.

In the SIF representation, a statement of the class SIF Sequential corresponds to the main process of the HDL code (410). The sequential statement is a compound statement that controls other statements such as basic statements and control statements (e.g., loop, if, case). Table 2 describes various types of basic SIF statements.

TABLE 2

Basic SIF Statements

| Type | Description |
| --- | --- |
| Assignment | Operations which involve data transfer without significant processing delay. Not mapped to library components, assignment operations are implemented in later synthesis by data path connections and merged into the multiplexer interconnection structure. Assignment operations relate to variables; accesses to signal are considered I/O operations. If a signal is local to a process and is not to be treated as I/O, the signal is transformed into a variable before scheduling. Assignment operations include assignments, concatenations, readslices, writeslices, multiplexer operations, and other simple logic functions |
| I/O | Operations involving signals, including inputs and outputs. If a data processing operation accesses a signal, an assignment is extracted to allow independent scheduling of the I/O operation and the data processing operation. If an input and an output of an operation are both signals, the operation is split using assignments so that the read and the write can be scheduled separately |

TABLE 2-continued

Basic SIF Statements

| Type | Description |
| --- | --- |
| Control Flow | Operations controlling the execution of a loop. Control flow operations appear as exit and next statements in VHDL, and as terminate or iterate statements in SIF. The evaluation of the condition of the exit/next statement is not part of the control flow statement. |
| Real | Operations which have a delay and are mapped to library components. Real operations include additions, multiplications, subtractions, divisions, comparisons, increments and decrements. |
| Clock synchronizations | Operations corresponding to statements that model cycle-by-cycle behavior in HDL code (e.g., WAIT statements in VHDL). Clock synchronizations are not ultimately scheduled, but rather are used to generate constraints in a design schedule. |

2. Creating a Constrained Control/Data Flow Graph

The architectural exploration component (430) creates a constrained control/data flow graph ["CDFG"] based upon data dependencies implicit in the SIF representation. The data dependencies indicate the order in which operations must be performed. In the constrained CDFG, nodes represent operations and dependency arcs connect nodes to indicate data dependencies.

The constrained CDFG maintains data dependencies and implies I/O timing requirements for the design. The constrained CDFG includes the input(s) and output(s), the operations, the flow of data from the input(s) to the output(s), and the control structures for conditionals and loops. I/O timing requirements relate to the timing of input and output operations, i.e., interface timing, and may imply a required I/O scheduling mode (e.g., fixed, super state, free) for the design.

3. Allocating Resources

The architectural exploration component (430) then creates a low-level CDFG based upon resource and cycle constraints. The architectural exploration component (430) determines how many and which kinds of resources will be used, which heavily influences the area/performance tradeoff for a design schedule. Allocating a large number of resources typically leads to a more parallel, faster design; allocating a small number typically leads to a slower, but smaller design.

In allocation, the designer can indicate a clock cycle constraint, libraries of components for operations, and number constraints for components. For operations, the designer can specify one or more types of components onto which operations can be mapped. Alternatively, the designer can specify that the design be scheduled with a maximum number of components, and the architectural exploration component (430) can automatically perform allocation.

After allocation, the low-level CDFG provides constraints used in later scheduling. These constraints includes clock frequency, resource assignments for operations, resource sharing constraints, resource number constraints, and initiation interval. A resource assignment for an operation indicates operation delay for the assigned component. A resource sharing constraint indicates whether operations may share a component. For example, if c-steps for the operations do not overlap or if the operations appear in exclusive branches, the operations can share a component. A resource number constraint restricts the number of available components, and can affect whether operations can share a component. In a pipelined loop, a subsequent iteration of the loop begins before the current iteration completes. The initiation interval indicates the number of cycles after which a new iteration starts in a pipelined loop.

4. Scheduling

A scheduler assigns operations to clock cycles to determine cycle-accurate behavior for the design. The scheduler, also described in the section entitled "Scheduling," operates in two stages.

In the first stage, the scheduler computes a schedule, but does not modify the SIF representation of the design. Instead, the hierarchical Gantt chart (440) presents the results of scheduling. The scheduler works with an interactive feedback loop that allows the designer to evaluate the architectute, adjust constraints, and reinvoke scheduling for a new architecture with a different area/performance tradeoff. The scheduler then generates new scheduling results, which are presented in the hierarchical Gantt chart (440). In alternative embodiments, a hierarchical Gantt chart presents scheduling results based upon a non-SIF representation of the design.

In the second stage, after the designer selects an implementation, the scheduler applies the schedule to modify the SIF representation of the design. The scheduler outputs scheduled SIF code (450), which can be simulated in cycle-accurate simulation. In the second stage, the hierarchical Gantt chart (440) is closed due to potential changes to the SIF representation.

D. RTL Code Generation

The RTL code generation component (460) converts the scheduled SIF code (450) into RTL code (470). In doing so, the RTL code generation component (460) optimizes memory allocation and binds operation components to structural components. The RTL code generation component (460) also performs optimizations to generate explicit finite state machines and data path components (e.g., registers, multiplexers, functional units). The optimizations include register and component sharing, multiplexer optimization, finite state machine optimization, and glue logic generation and optimization.

The RTL code generation component (460) performs optimizations and generates RTL netlists in two steps. After the first step, the RTL netlist is at the operation level. After the second step, the RTL netlist is structural (i.e., operations are bound to structural components). The RTL code (470) can be simulated in RTL simulation and passed to one or more downstream synthesis tools (e.g., an RTL synthesis tool).

III. Scheduling

The scheduler assigns operations to clock cycles to determine the cycle-by-cycle behavior of a design. The scheduler separately schedules fragments of the design called basic blocks. The scheduler treats a loop body as a basic block. When a basic block is scheduled, the scheduler assigns every operation of the block to a c-step. C-steps are numbered from 1 to N relative to the start of the block. In addition, the scheduler may schedule operations other than real operations and I/O writes in a c-step 0 for the block.

The scheduler determines a design schedule based upon various constraints imposed by the designer and upstream design tool components. The SIF representation implies data dependency and I/O timing constraints. Resource allocation provides clock cycle, resource assignment, resource sharing, resource number, and initiation interval constraints. The designer can further provide relative timing, absolute timing, and latency constraints.

The scheduler is called one or more times for each basic block. If the scheduler is called multiple times, quadratic algorithms may be used to solve for a design schedule in terms of number of operations, variables, constraints, c-steps, etc. Numerous scheduling algorithms exist; different algorithms are optimized for different circumstances. The scheduler uses any of an As Soon As Possible (ASAP) algorithm, an As Late As Possible (ALAP) algorithm, and an incremental heuristic algorithm. In alternative embodiments, the scheduler uses a list algorithm, a force-directed algorithm, another heuristic algorithm, integer linear programming techniques, or some other type of scheduling algorithm.

In alternative embodiments, the scheduler produces a design schedule according to other scheduling rules.

A. Basic Blocks

A basic block is a fragment of the design (in SIF representation) which is scheduled separately. A basic block is typically a list of statements, for example, statements of a loop body. Basic blocks may be nested, and nested basic blocks are scheduled in a depth first manner by default. A nested block is treated as an assignment operation during scheduling of its enclosing block.

The scheduler separately schedules each basic block, and a set of controller states is reserved for each block. Each controller state of the design schedule can be matched to a block. Until later synthesis generates a controller, the controller states are represented as clock synchronizations. All real or I/O write operations of different blocks are separated by at least one clock synchronization to keep them in different states.

Basic blocks are determined before scheduling. The scheduler identifies basic blocks, for example, identifying loops or other fragments that should be scheduled separately (e.g., different length branches of an if/then statement). The designer can follow design conventions to segregate basic blocks into loops for scheduling. In an alternative embodiment, the designer annotates code with user programs to indicate basic blocks to the scheduler.

The scheduler recognizes pipelined loops. Pipelining is a loop optimization to increase throughput by starting an iteration of the loop before the previous iteration finishes. The innermost basic block of a loop may be pipelined. To pipeline an entire loop, the loop must consist of a single basic block without sub-loops (or with the sub-loops completely unrolled).

The scheduler can schedule multi-cycle operations. A multi-cycle operation is scheduled across more than one cycle, which requires transfer of operands and results to and from data path components in different c-steps. Whether an operation is multi-cycle depends on the component mapped to the operation and the cycle constraint.

B. Control Steps ["C-Steps"]

When a basic block is scheduled, the scheduler assigns every operation of the block to a c-step. A c-step represents a clock cycle in a block iteration. For each block, the number of c-steps corresponds to the number of clock cycles in one iteration of the block. For a design with nested blocks, the total number of clock cycles needed to execute the design is the sum of, for each block, the number of c-steps multiplied by the number of iterations.

The scheduler numbers c-steps for each block from 1 to N relative to the start of the block. N is the latency of the block. If a block includes branches of an if/then or case statement, the 1 to N numbering separately continues over each branch. For example, for a block with alternative single c-step branches, each branch's c-step has the same c-step number. To enforce consistent numbering of c-steps that follow the branches, each branch has the same number of c-steps. If different branches have different numbers of c-steps, the different branches are treated as sub-blocks.

Clock synchronizations separate c-steps in the SIF representation. Each c-step numbered from 1 to N is preceded by a clock synchronization. Thus, the number of a c-step indicates the number of clock synchronizations preceding the c-step, and the number of clock synchronizations in a block indicates the latency of the block.

The scheduler can assign certain operations to a c-step 0 for a block, in which case the operations execute in the previous controller state. Real operations and I/O write operations cannot be scheduled in c-step 0, but other types of operations (including loop statements treated as assignments) can. If a block has no real or I/O write operations, the latency of the block may be 0 c-steps, and the block does not require any clock synchronizations.

The last c-step of a basic block is not followed by a clock synchronization. To enforce the condition that real and I/O write operations of different basic blocks are separated by at least one clock synchronization, real and I/O write operations are not scheduled after a nested block in the same c-step. The enclosing block includes a clock synchronization statement after the block before a real operation executes in the enclosing block.

The designer can constrain the timing of a design schedule through relative timing, absolute timing, and/or latency constraints. A relative timing constraint defines the relative position of two operations in the same block; a constraint not to schedule two operations in the same block is specified as a resource constraint. A relative timing constraint can specify a minimum, a maximum, or an exact distance between operations. Distances are in units of c-steps and refer to static scheduling results. When no sub-block exists between constrained operations, the scheduling delay corresponds to actual delay between the constrained operations. A latency constraint specifies the latency of a block, and can specify a minimum, maximum, or exact latency. Internally, each block has a start operation and an end operation. A latency constraint is transformed into a relative timing constraint between the start and end operations. An absolute timing constraint specifies the c-step in which an operation must be scheduled, relative to the start of the block including the operation.

C. I/O Scheduling Modes

The scheduler operates in any of several available I/O scheduling modes. Different modes give the scheduler different degrees of freedom to change the external behavior of the design. An I/O scheduling mode defines where the scheduler may insert or remove clock synchronizations and how the scheduler may move operations. Table 3 summarizes I/O three scheduling modes.

TABLE 3

I/O Scheduling Modes

| Mode | Description |
|---|---|
| Fixed | The external cycle-by-cycle behavior of the design at the interface is not changed; simulation of I/O assignments matches before and after scheduling. Basic blocks keep their latency; the rules enforcing uniform branch length are satisfied before scheduling. I/O operations, control flow operations, and sub-blocks are scheduled where they appear before scheduling. Real and assignment operations may be moved, so long as data dependencies are not violated, because the scheduling of these operations does not affect external behavior. |
| Super State | Scheduling may expand an original control state to a set of one or more control states called a super state, which entails insertion of clock synchronizations. The order of I/O operations is not changed. In every block, I/O operations, control flow operations, and sub-blocks are scheduled where they appear before scheduling, and I/O operations are kept in order with control flow operations and sub-blocks. I/O write operations, however, are scheduled in the last state of a super state. |

TABLE 3-continued

I/O Scheduling Modes

| Mode | Description |
|---|---|
| Free | The scheduler ignores original clock synchronizations, and may change the latency of blocks. I/O operations to the same port, however, are scheduled in their original order, and I/O operations are kept in order with control flow operations and sub-blocks. The designer can explicitly impose additional timing constraints. |

In fixed and super state modes, the scheduler may not add clock synchronizations between I/O write operations. Because of the condition that I/O write operations of different blocks must be separated by at least one clock synchronization, scheduling of certain specifications is infeasible.

IV. Hierarchical Gantt Chart

A hierarchical Gantt chart helps the designer visualize the results of scheduling, and accurately presents the actual timing and scheduling of a design schedule. The hierarchical Gantt chart includes a hierarchical list of scheduled operations and hierarchical design schedule blocks. The hierarchical Gantt chart represents operations with negligible or no delay using pseudo-operation icons.

Figure 5:
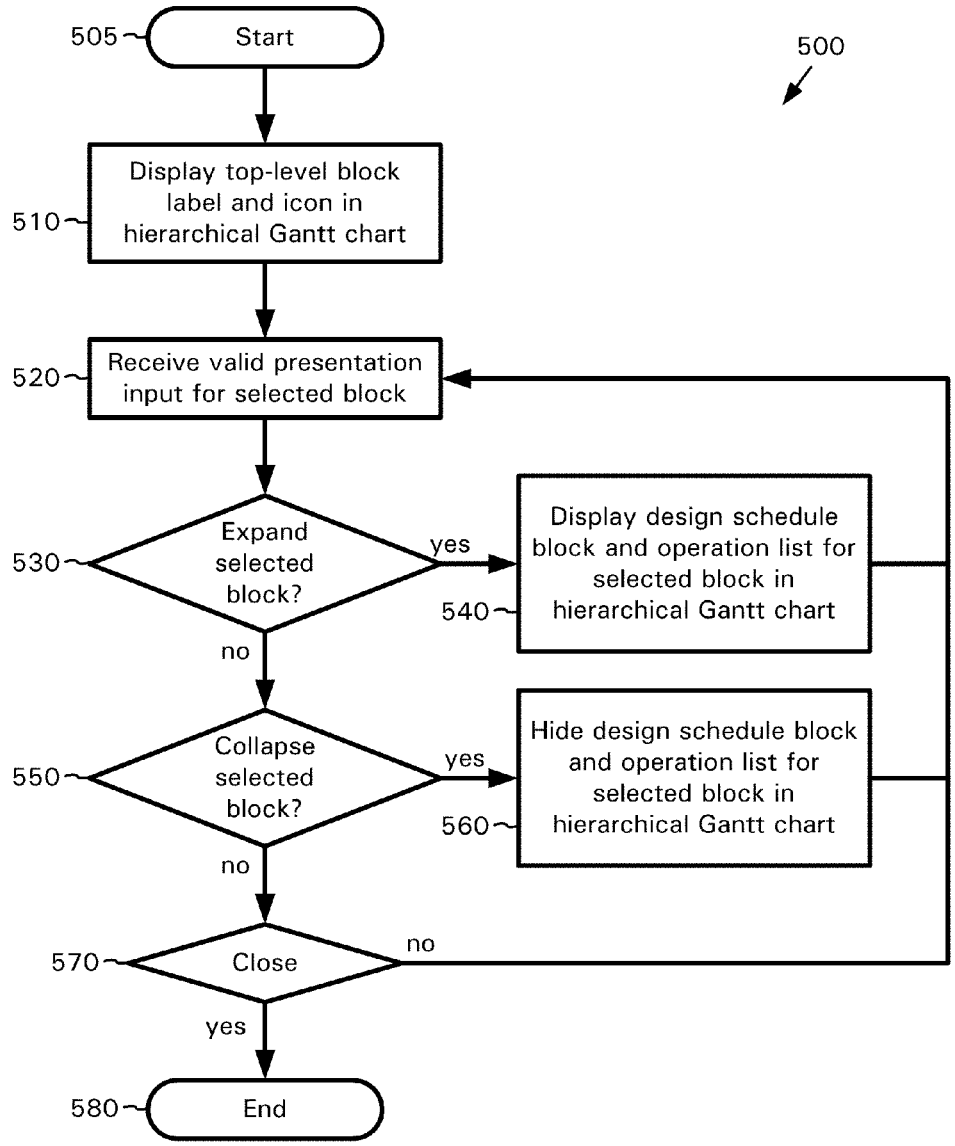
FIG. 5 is a flow chart for presenting design schedule information in a hierarchical Gantt chart according to the illustrative embodiment.

FIG. 5 shows a technique (500) in a design tool for presenting scheduling information (including design schedule blocks and a list of scheduled operations) in a hierarchical Gantt chart according to the illustrative embodiment. The design tool of FIG. 5 expands or collapses presentation of scheduling information for a block in response to commands from the designer.

After the start (505), the design tool displays (510) a label and icon for a top-level loop in the hierarchical Gantt chart. The label and icon summarize the top-level loop, which includes zero or more nested blocks, in a collapsed form. Each of the zero or more nested blocks is for a nested loop, a branch of execution, or another separately scheduled fragment of the design.

The design tool then receives (520) valid presentation input for a selected block. For example, if a selected block is collapsed, valid presentation input for the selected block expands the block. If a selected block is expanded, valid presentation input for the selected block collapses the block.

If the presentation input directs the design tool to expand (530) the selected block, the design tool displays (540) the design schedule block and operation list for the selected block in the hierarchical Gantt chart. If the presentation input directs the design tool to collapse (550) the selected block, the design tool hides (560) the design schedule block and operation list for the selected block in the hierarchical Gantt chart, for example, presenting instead a label and icon. If the presentation input directs the design tool to close (570) the hierarchical Gantt chart, the technique (500) ends (580).

In practice, the design tool receives numerous other kinds of presentation input from the designer, for example, commands to alter presentation of the hierarchical Gantt chart in another manner, adjust scheduling constraints, recalculate scheduling results, or apply scheduling results to SIF code.

The design tool can hierarchically presents design schedule blocks and lists of scheduled operations together or separately. In alternative embodiments, the design tool uses other techniques to hierarchically present scheduling information.

A. Hierarchical Design Schedule Blocks

Figure 6C:
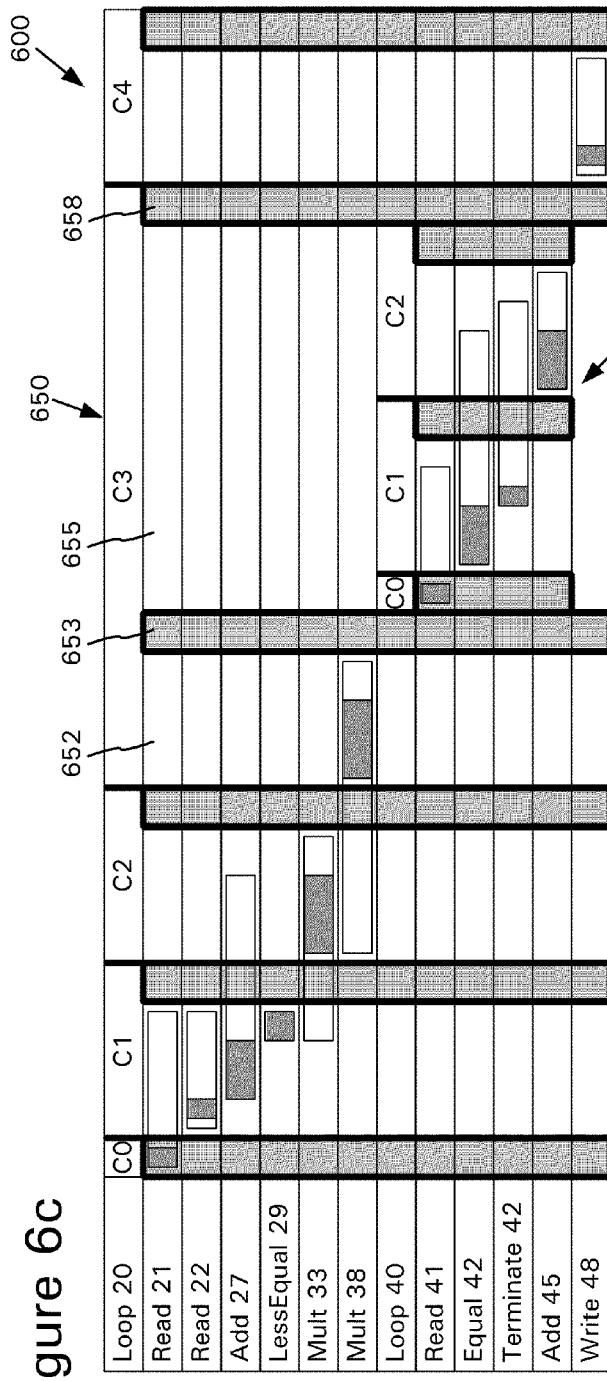
Figure 6D:
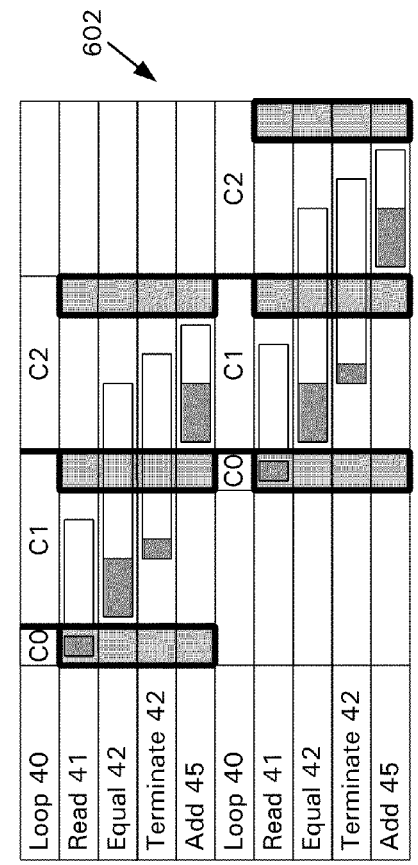

FIGS. 6a-6d are diagrams of hierarchical design schedule blocks for a design schedule with a nested block for a nested loop. FIGS. 6a-6c show various views of the hierarchical design schedule blocks, and FIG. 6d shows a pipelined design schedule block for the nested loop.

FIG. 6a shows a design schedule block (600) for a Loop 20, which encloses Loop 40. A column (610) listing scheduled operations includes a label (612) for the Loop 20 block and labels for the non-filtered operations of the Loop 20 block. The non-filtered operations include real operations such as Add 27 (label 614) as well as the Loop 40 sub-block (label 616).

The design schedule block (600) includes five c-steps (620, 630, 640, 650, 660) numbered relative to the beginning of the design schedule block (600). Clock synchronization operations (shown as bold-face vertical bars) separate the c-steps. Each c-step includes a clock overhead space (shown as shaded space), which is reserved for certain types of operations with neglible or no delay. For example, c-step C4 (660) is separated from c-step C3 (650) with a clock synchronization (661). C-step C4 includes a clock overhead space (668). As the last c-step of the Loop 20 block, a clock synchronization of the Loop 20 block does not follow c-step C4.

For each scheduled operation, the design schedule block (600) shows a scheduled position (shown as heavily shaded space) within a scheduling frame (shown as a rectangular outline). The scheduling frame indicates potential locations for the operation in the design schedule block (600), depending on the scheduling algorithm used (e.g., ASAP, ALAP), and preserving data dependencies within the block. For example, the operation Write 48 (label 618) has a scheduled position (664) in c-step C4 (660). The scheduling frame (665) for the operation indicates the potential locations for the scheduled position (664).

Real operations (e.g., additions, multiplications) are scheduled in the real spaces (shown as clear areas) of the c-steps of the design schedule block (600), and other operations can also be scheduled in the real spaces. For example, the real space (662) of c-step C4 (660) includes the scheduled position (664) for the operation I/O operation Write 48 (label 618). Basic sub-blocks for nested blocks are scheduled inside a clock overhead space. Assignment, I/O, and control flow operations can be scheduled inside clock overhead spaces or real spaces. C-step C0 (620) includes clock overhead space, but no real space. Only basic sub-blocks, and assignments, I/O reads, and control flow operations are scheduled in c-step C0 (620).

In the design schedule block (600) for the Loop 20 block, the nested Loop 40 sub-block is scheduled in c-step C3 (650) as a single operation with negligible delay (namely, an assignment operation). Responsive to designer input, the design tool expands or collapses presentation of design schedule sub-block for nested Loop 40. FIGS. 6b and 6c show two different expanded presentations of the design schedule sub-block (601) for nested Loop 40.

FIG. 6b shows the design schedule sub-block (601) as viewed in a separate window from the design schedule block (600). The design schedule sub-block (601) includes three c-steps (670, 680, 690) numbered relative to the beginning of the design schedule sub-block (601). The constraints of the design schedule sub-block (601) can differ from the constraints of the design schedule block (600), but the same rules for presenting clock synchronizations, clock overhead spaces, real spaces, and operation assignments apply.

FIG. 6c shows the design schedule sub-block (601) nested within the design schedule block (600). The design schedule sub-block (601) is nested within c-step C3 (650) of the design schedule block (600). To present the design schedule sub-block (601), the design tool expands c-step c3 (650) of the design schedule block (600). Before a clock overhead space (658), the expanded c-step C3 (650) includes an additional overhead space (653) in which operations with negligible or no delay can be scheduled. The additional overhead space (653) separates the real space (652) of c-step C3 (650) from sub-block space (655) that contains the design schedule sub-block (601) but no operations of the design schedule block (600). The design schedule sub-block (601) itself is the same as in FIG. 6b. Both the design schedule block (600) and the design schedule sub-block (601) end without clock synchronization operations.

FIG. 6d shows a pipelined design schedule sub-block (602) for nested Loop 40 as viewed in a separate window from the design schedule block (600). The pipelined design schedule sub-block (602) shows a second iteration of the nested Loop 40 beginning as the first iteration completes its c-step C1. Each iteration of the pipelined design scheduled sub-block (602) includes independently numbered c-steps relative to the start of the iteration. The pipelined design schedule sub-block (602) can be nested within the design schedule block (600).

FIGS. 7a-7e are screen shots of a hierarchical Gantt chart (700) with a hierarchical list (710) of scheduled operations, hierarchical design schedule blocks (720), and pseudo-operation icons. The hierarchical Gantt chart (700) shows a design schedule for the VHDL listing (100) of FIG. 1. FIGS. 7a-7e show various views of the hierarchical Gantt chart (700) as presentation of scheduling information for the nested blocks expands.

The hierarchical Gantt chart (700) includes a row (705) of buttons that the designer actuates when interactively exploring the design schedule. From left to right, the functions of the buttons are: select mode, dataflow mode, configure, print, show loops only, zoom in, zoom out, zoom fit, zoom full, recalculate schedule, and apply schedule. The hierarchical list (710) and the pseudo-operation icons are described below.

Figure 7A:
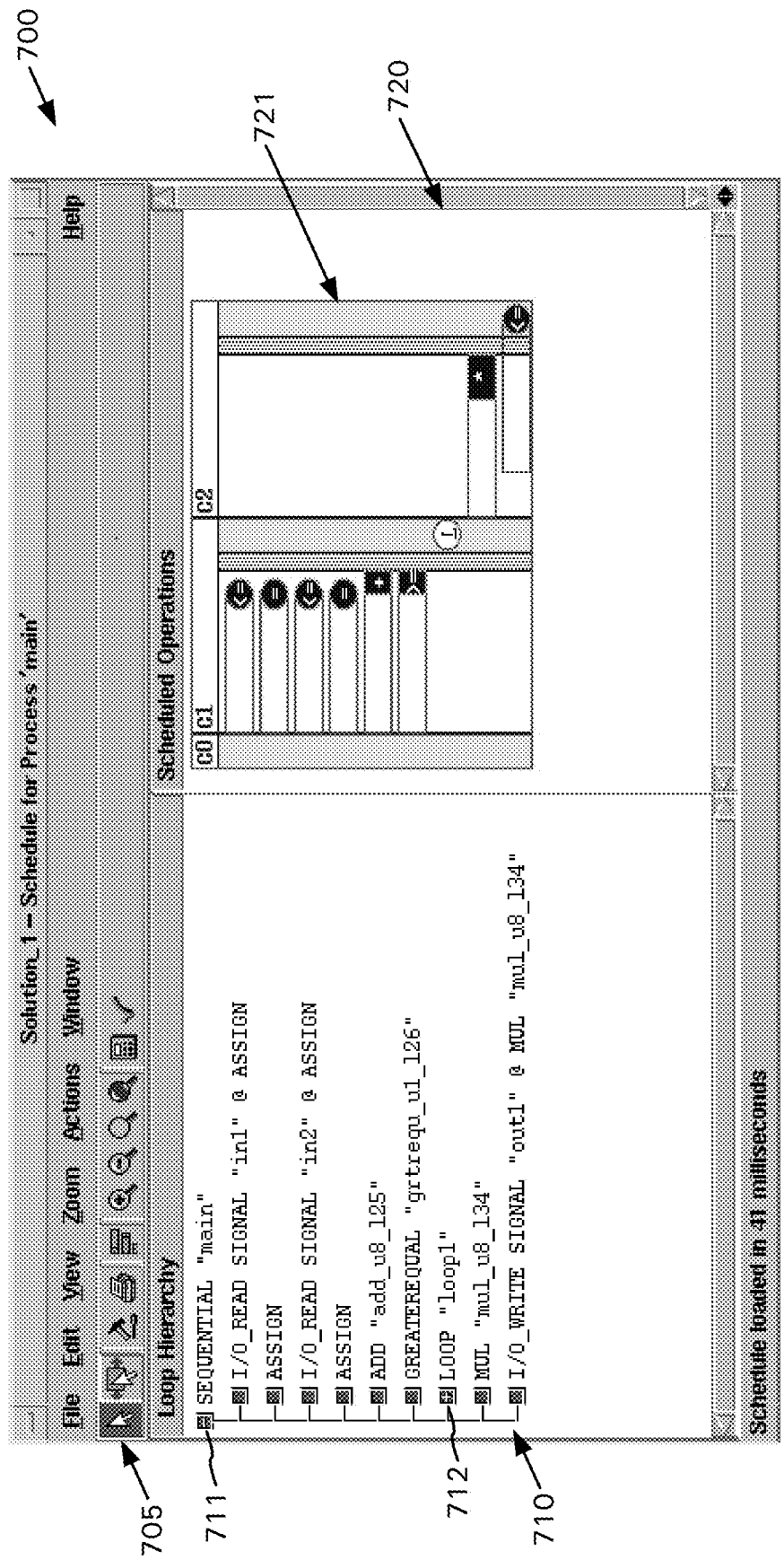
FIGS. 7a-7e are screen shots of a hierarchical Gantt chart with hierarchical design schedule blocks, a hierarchical list of scheduled operations, and pseudo-operation icons according to the illustrative embodiment.

FIG. 7a shows the hierarchical Gantt chart (700) with collapsed presentation of scheduling information for the WHILE loop (120) and FOR loops (130, 140). The design schedule block (721) for the main loop (110) is scheduled in two c-steps. For each scheduled operation of the main loop (110), the main loop design schedule block (721) includes an operation icon indicating a schedule position, and a schedule frame can indicate a range for the schedule position. I/O read and assignment operations do not execute in c-step C0, as the main loop (110) is the top-level loop. The design schedule block for the WHILE loop (140) is presented as a single operation icon labeled L in the clock overhead space of c-step C1 in the main loop design schedule block (721).

Figure 7B:
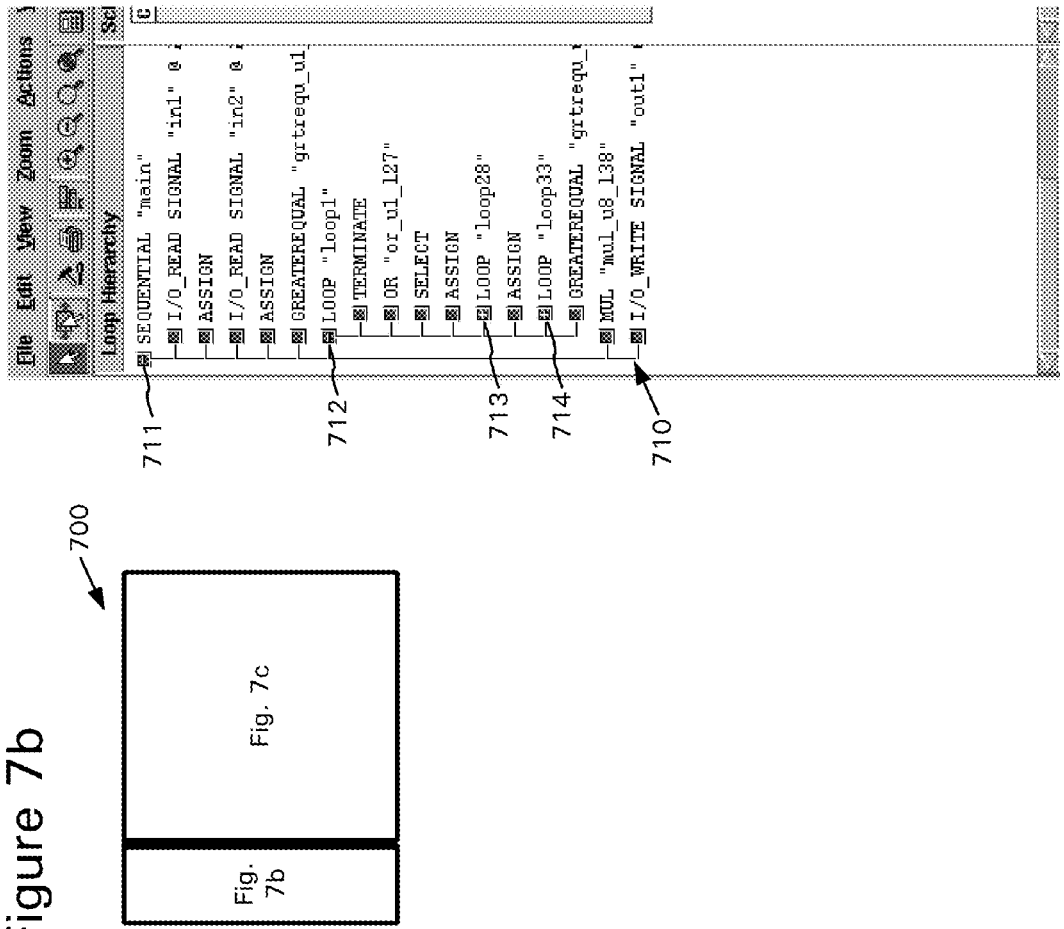
Figure 7C:
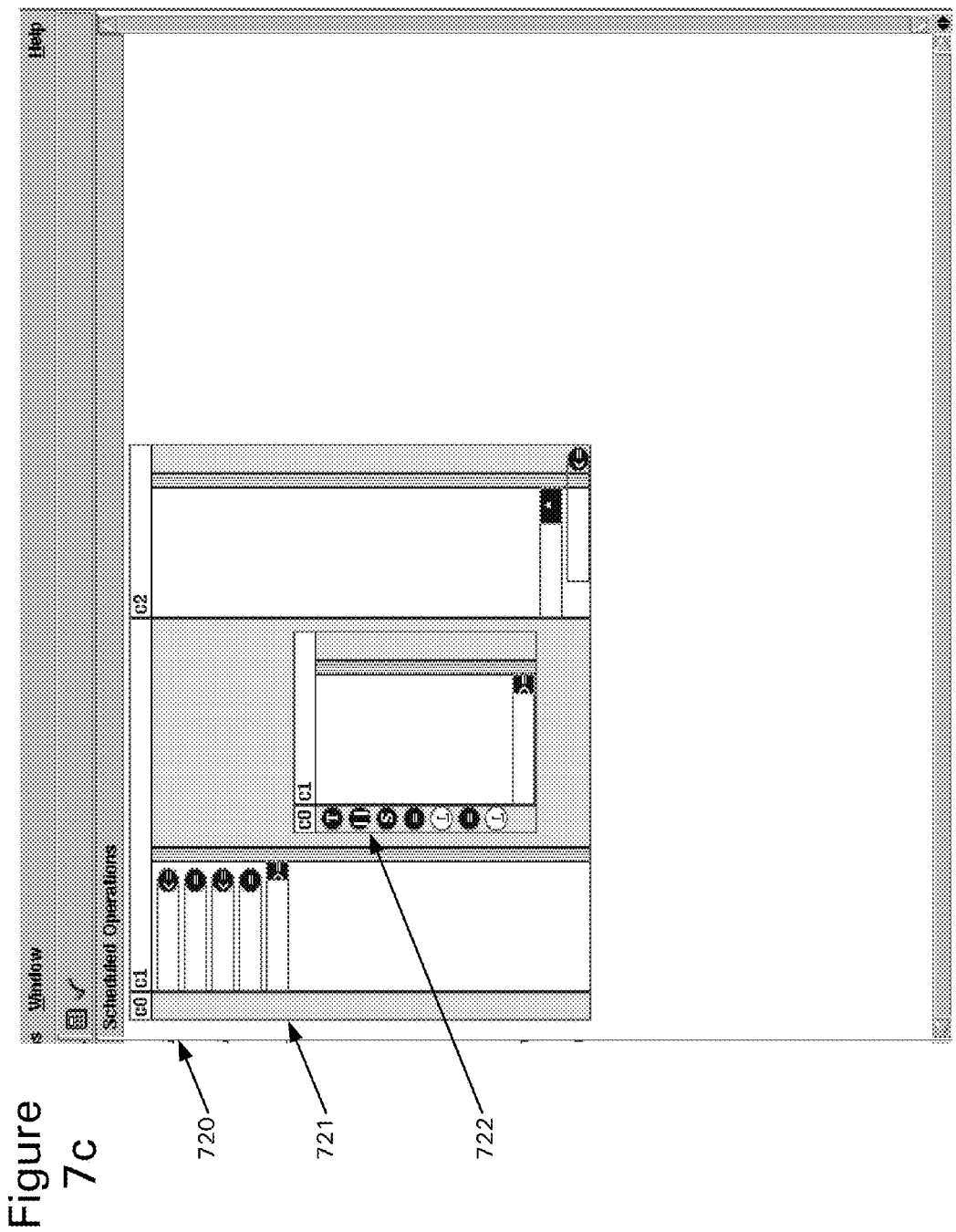

FIGS. 7b and 7c show the hierarchical Gantt chart (700) with expanded presentation of scheduling information for the WHILE loop (120) and collapsed presentation of scheduling information for the FOR loops (130, 140). The design schedule block (722) for the WHILE loop (120) is scheduled in a single c-step and presented in the clock overhead space of c-step C1 of the main loop design schedule block (721). For the WHILE loop design schedule block (722), I/O read, assignment, and control flow operations are scheduled in c-step C0. The design schedule blocks for the FOR loops (130, 140) are presented as single operation icons labeled L in c-step C0 of the WHILE loop design schedule block (722). A real operation icon represents the GREATEREQUAL operation (a real operation) in the real space of c-step C1 of the WHILE loop design schedule block (722).

Figure 7D:
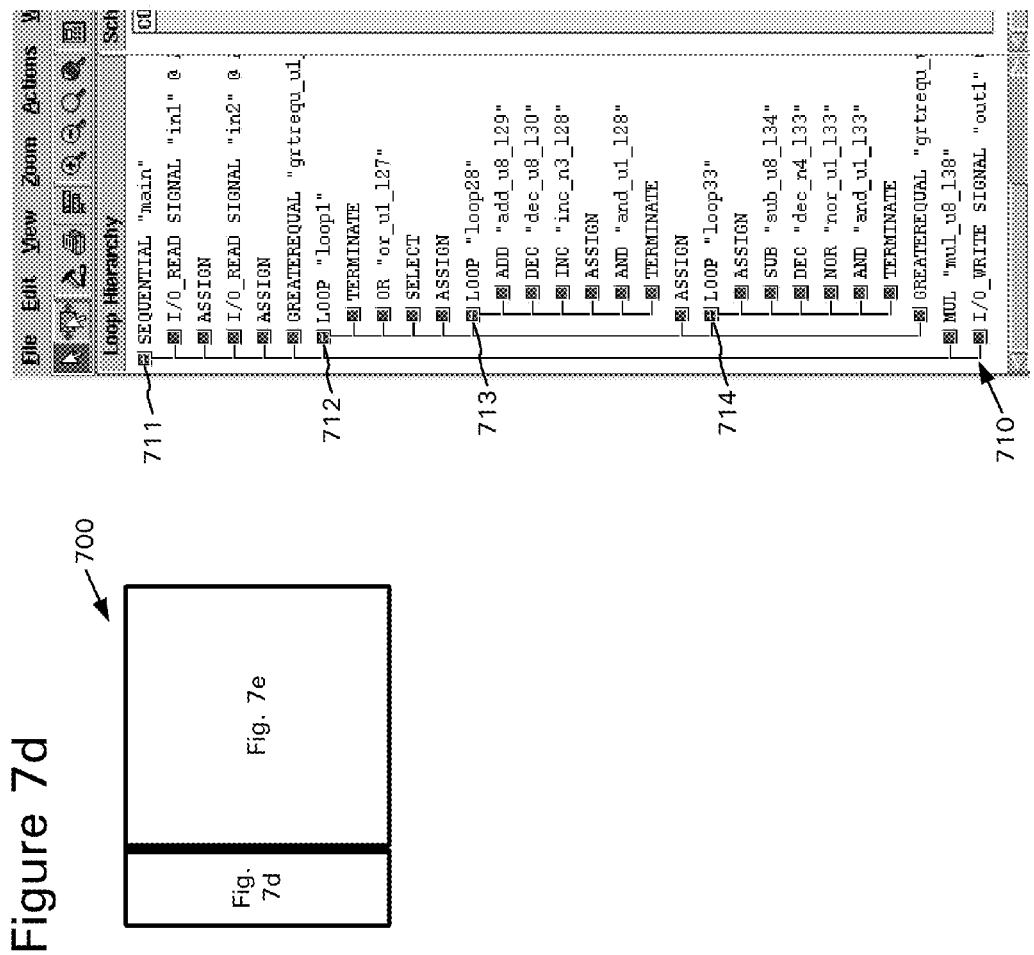
Figure 7E:
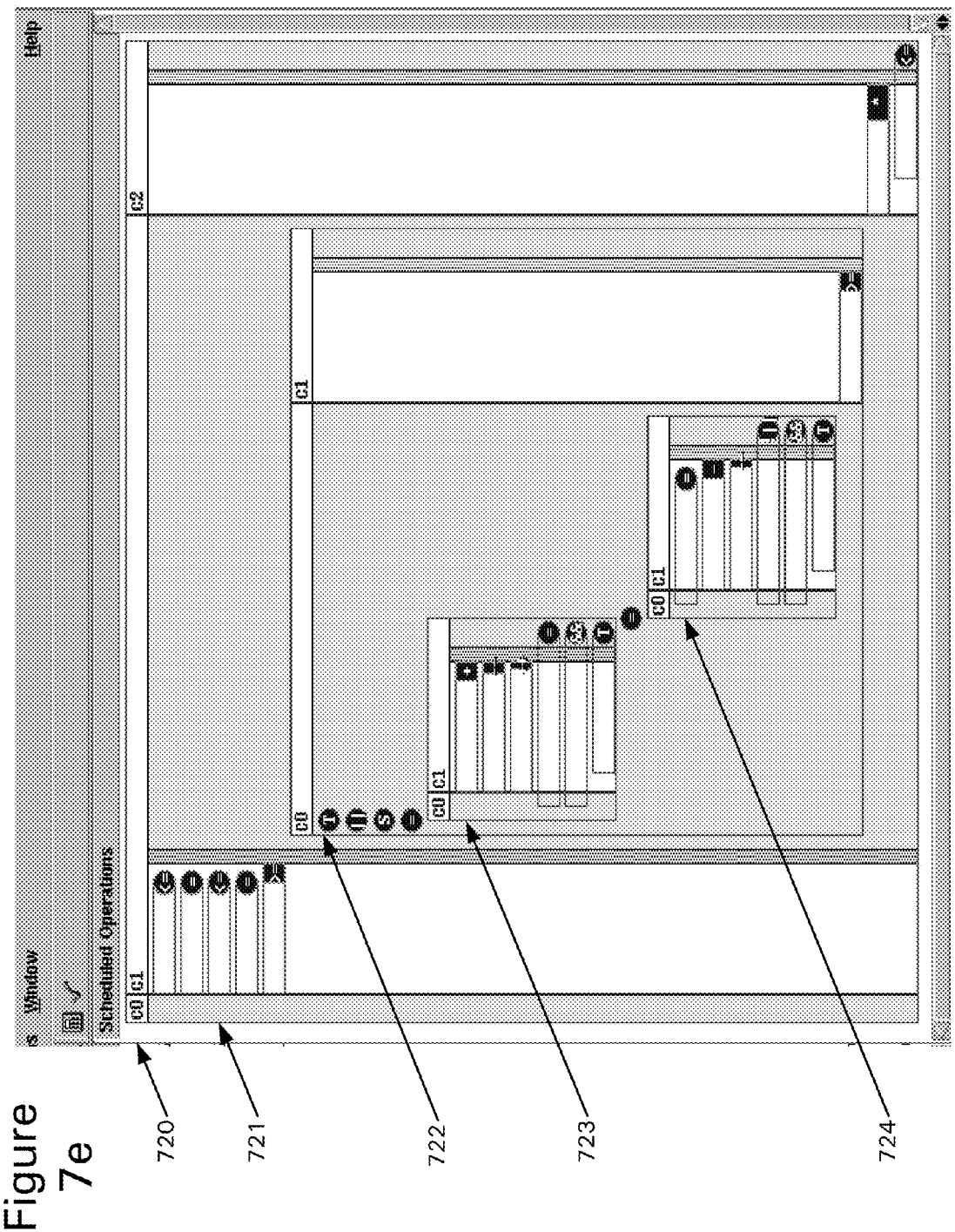

FIGS. 7d and 7e show the hierarchical Gantt chart (700) with expanded presentation of scheduling information for the WHILE loop (120) and the FOR loops (130, 140). Each of the design schedule blocks (723, 724) for the FOR loops (130, 140) is scheduled in a single c-step; both are presented in c-step C0 of the WHILE loop design schedule block (722). For the FOR loop design schedule blocks (723, 724), real operation icons represent real operations (i.e., addition, subtraction, decrements, increment) in the real space of the FOR loop design schedule blocks (723, 724). Pseudo-operation icons represent other operations anywhere in the FOR loop design schedule blocks (723, 724), so long as data dependencies are preserved.

B. Hierarchical. List of Scheduled Operations

FIGS. 7a, 7b, and 7d show a hierarchical list (710) of scheduled operations that expands and collapses as the design tool expands and collapses presentation of nested blocks. The hierarchical list (710) emphasizes which scheduled operations are associated with which nested blocks, making it easier for the designer to understand the hierarchical Gantt chart.

The hierarchical list (710) includes labels for scheduled operations. The hierarchical list (710) indents labels for the operations of a nested block to offset their presentation relative to labels for the operations of the enclosing block. The hierarchical list (710) presents a block icon adjacent a label for nested block. The block icon indicates whether presentation of scheduling information for the nested block is expanded ("-") or collapsed ("+"). Alternatively, the hierarchical list (710) uses only indentation, uses a different block icon convention, or uses another technique for emphasizing presentation of labels for nested block operations relative to labels for enclosing block operations.

In FIG. 7a, the hierarchical list (710) includes labels for main loop operations indented relative to a block label SEQUENTIAL "main" for the entire design. Adjacent the block label for the entire design, a block icon (711) indicates that the presentation of scheduling information for the main loop (110) is expanded. The block icon (712) adjacent the label LOOP "loop1" indicates collapsed presentation of scheduling information for the WHILE loop (120).

In FIG. 7b, the hierarchical list (710) expands the presentation of scheduling information for the WHILE loop (120), presenting labels for WHILE loop operations indented relative to labels for the main loop operations. The block icon (712) for the WHILE loop (120) indicates the expanded presentation of scheduling information for the WHILE loop (120). The block icons (713, 714) adjacent the FOR loop labels LOOP "loop28" and LOOP "loop33" indicate collapsed presentation of scheduling information for those loops.

In FIG. 7d, the hierarchical list (710) expands the presentation of scheduling information for the FOR loops (130, 140), presenting labels for FOR loop operations indented relative to the labels for the WHILE loop operations. The block icons (713, 714) adjacent the FOR loop labels LOOP "loop28" and LOOP "loop33" indicate expanded presentation of scheduling information for those loops.

C. Presentation of Pseudo-Operation Icons

FIGS. 7a, 7c, and 7e show real operation icons and pseudo-operation icons in the hierarchical design schedule blocks (720) of the hierarchical Gantt chart (700). The real operation icons are rectangular; the pseudo-operation icons are circular. Each operation icon has a character label identifying the operation that the icon represents. In addition, different types of operations are represented with different color icons. For example, the loop operation icon is white with black characters, while other operation icons are shaded with white characters.

The rectangular real operation icons represent scheduled operations with significant delay. The width of a real operation icon roughly indicates actual delay for the operation using the component mapped to the operation and relative to the duration of a clock cycle. Real operation icons represent real operations (e.g., additions, subtractions, multiplications, divisions, comparisons, increments, decrements) that are ultimately synthesized to corresponding structural components.

The circular pseudo-operation icons represent scheduled operations with negligible delay as well as notional scheduled operations (which help illustrate scheduling but have no exact structural counterpart). The shape of a pseudo-operation icon does not correlate with a delay, and does not mislead the designer by presenting an operation as having a significant actual delay. Operations represented by pseudo-operation icons are typically synthesized into data paths, multiplexers, or other connection logic, or have a minimal delay. In the illustrative embodiment, pseudo-operation icons represent assignments (including loops treated like assignments), I/O operations, and control flow operations.

In an alternative embodiment, a Gantt chart uses rectangular icons with pointed ends for all operations. Thus, a six-sided icon represents a real operation, with icon width roughly indicating actual delay for the real operation. For a pseudo-operation, the six-sided icon collapses to a diamond as the width of the top and bottom sides is reduced to zero. The six-sided icon can show a range of delays down to zero, and the pointed ends form a diamond that is visible for operations with negligible or no delay.

In other alternative embodiments, a Gantt chart uses other conventions to differentiate icons for different types of operations. These conventions can use any combination of shape, color, and character identifiers, and can operate along a different partitioning of operation types.

Having described and illustrated the principles of our invention with reference to an illustrative embodiment, it will be recognized that the illustrative embodiment can be modified in arrangement and detail without departing from such principles. It should be understood that the programs, processes, or methods described herein are not related or limited to any particular type of computer apparatus, unless indicated otherwise. Various types of general purpose or specialized computer apparatus may be used with or perform operations in accordance with the teachings described herein. Elements of the illustrative embodiment shown in software may be implemented in hardware and vice versa.

In view of the many possible embodiments to which the principles of our invention may be applied, it should be recognized that the detailed embodiments are illustrative only and should not be taken as limiting the scope of our invention. Rather, we claim as our invention all such embodiments as may come within the scope and spirit of the following claims and equivalents thereto.

We claim:

1. A computer-readable memory or storage device storing computer-executable instructions, which when executed by a computer cause the computer to perform a method, the method comprising:
displaying a top-level schedule for an electronic circuit design that includes one or more loops associated with the electronic circuit, the top-level schedule being divided into steps, where each step represents a clock cycle in an iteration of a loop, and wherein timing within the top-level schedule is presented relative to the top-level schedule; and
displaying a first loop schedule, nested within the top-level schedule, for a first loop of the one or more loops, wherein timing within the first loop schedule is independent of top-level clock timing and is presented relative to the first loop schedule, with the first loop schedule being divided into sub-steps, wherein each sub-step represents a clock cycle in an iteration of the first loop and the first loop schedule, including the sub-steps, is presented within a step of the top-level schedule.

2. The computer-readable memory or storage device of claim 1, wherein the method further comprises hiding the first loop schedule responsive to a command from a designer.

3. The computer-readable memory or storage device of claim 1, wherein the method further comprises:
displaying a textual list of scheduled operations; and
displaying an icon adjacent a first loop label in the textual list, the icon indicating whether the first loop schedule is expanded or collapsed.

4. The computer-readable memory or storage device of claim 1, wherein the top-level schedule includes at least one pseudo-operation icon.

5. The computer-readable memory or storage device of claim 1, wherein the first loop includes plural alternative branches of execution having different lengths.

6. A computer-readable memory or storage device storing computer-executable instructions, which when executed by a computer cause the computer to perform a method, the method comprising:
presenting a first level schedule for a block of a design of an electronic circuit, the block including a sub-block nested within the block of the design; and
presenting second information for the sub-block of the design, wherein timing within the block is presented as independent of timing within the sub-block, and wherein the timing within the sub-block is presented as independent of the timing within the block, the timing of both the block and sub-block being associated with the timing of the electronic circuit, the timing of the sub-block being presented to show a respective scheduled position of operations of the sub-block within a range of potential locations.

7. The computer-readable memory or storage device of claim 6, wherein the first information is divided into control steps, wherein each control step represents a clock cycle in a block iteration, and wherein the second information is divided into sub-control steps, wherein each sub-control step represents a clock cycle in an iteration of the sub-block.

8. The computer-readable memory or storage device of claim 7, wherein the control steps indicate the timing within the block and the timing within the sub-block loop, and wherein each of the block and the sub-block loop includes an independently numbered set of control steps.

9. The computer-readable memory or storage device of claim 6, wherein the sub-block is for one of plural alternative branches of execution within the block.

10. The computer-readable memory or storage device of claim 6, wherein the first level schedule is a block schedule and the second level schedule is a sub-block schedule or an icon representing a sub-block loop schedule.

11. The computer-readable memory or storage device of claim 6, wherein timing within the sub-block is presented relative to the sub-block.

12. The computer-readable memory or storage device of claim 6, wherein the presenting the second level schedule nests the second level schedule within the first level schedule.

13. The computer-readable memory or storage device of claim 6, wherein the method further comprises presenting a list of operation labels including one or more sub-block loop operation labels indented relative to one or more block operation labels in the list.

14. The computer-readable memory or storage device of claim 6, wherein the method further comprises presenting a third level schedule for a second sub-block of the design, wherein the timing within the block is presented as independent of timing within the second sub-block, and wherein the timing within the second sub-block is presented as independent of the timing within the block.

15. The computer-readable memory or storage device of claim 6, wherein the timing within the block is presented as independent in that the second level schedule is presented within a single control step of the block regardless of the number of control steps of the sub-block.

16. A computer-readable memory or storage device storing computer-executable instructions, which when executed by a computer cause the computer to perform a method, the method comprising:
   presenting a top-level schedule that includes one or more nested loop schedules, wherein the top-level schedule is divided into control steps, wherein each control step represents a clock cycle; and
   presenting plural nested loop schedules for a design of an electronic circuit, each of the plural nested loop schedules under a top-level schedule including:
   a line of control step labels, wherein control step timing for each of the plural nested loop schedules is relative to that nested loop schedule and the control step timing for each nested loop schedule and the top-level schedule is independent of the control step timings for the other nested loop schedules and the top-level schedule, the control step timing representing one or more clock cycles in a block iteration, and
   one or more lines of schedule information including at least one operation icon.

17. The computer-readable memory or storage device of claim 16, wherein presentation of each of the plural nested loop schedules other than the top-level schedule is in a clock overhead space of a control step of the schedule enclosing the nested loop schedule.

18. The computer-readable memory or storage device of claim 16, wherein presentation of each of the plural nested loop schedules expands or collapses responsive to designer input.

19. The computer-readable memory or storage device of claim 16, wherein each of the at least one operation icon represents a scheduled operation.

* * * * *